(12) United States Patent
Nakayama

(10) Patent No.: US 8,194,714 B2
(45) Date of Patent: Jun. 5, 2012

(54) LIGHT EMITTING AND RECEIVING DEVICE

(75) Inventor: Hitoshi Nakayama, Fujimi (JP)

(73) Assignee: Seiko Epson Corporation (JP)

( * ) Notice: Subject to any disclaimer, the term of this patent is extended or adjusted under 35 U.S.C. 154(b) by 208 days.

(21) Appl. No.: 12/781,257

(22) Filed: May 17, 2010

(65) Prior Publication Data
US 2010/0295065 A1    Nov. 25, 2010

(30) Foreign Application Priority Data

May 19, 2009  (JP) ................................ 2009-120599

(51) Int. Cl.
H01S 5/00    (2006.01)
H01L 21/00   (2006.01)
(52) U.S. Cl. ........ 372/50.21; 372/50.1; 438/27; 438/57; 438/69; 257/80; 257/84
(58) Field of Classification Search .................... 438/22, 438/27–32, 57, 69–81; 257/79–85; 372/43.01–50.23
See application file for complete search history.

(56) References Cited

U.S. PATENT DOCUMENTS

| 5,978,401 | A  | * | 11/1999 | Morgan ............... 372/50.21 |
| 6,535,538 | B1 | * | 3/2003  | Lee et al. ............ 372/50.21 |
| 6,638,773 | B1 | * | 10/2003 | Hwang et al. ............ 438/2 |
| 6,703,644 | B1 | * | 3/2004  | Lell ....................... 257/84 |
| 6,927,412 | B2 | * | 8/2005  | Takahashi et al. ....... 257/13 |
| 2003/0007527 | A1 | * | 1/2003 | Tsukiji et al. .......... 372/46 |
| 2003/0062528 | A1 | * | 4/2003 | Yoshida et al. ......... 257/79 |
| 2007/0071054 | A1 | * | 3/2007 | Takahashi ............ 372/50.1 |
| 2008/0251794 | A1 | * | 10/2008 | Koda et al. ............ 257/80 |

FOREIGN PATENT DOCUMENTS

JP    10-003691    1/1998

* cited by examiner

Primary Examiner — Michael Lebentritt
Assistant Examiner — Karen Kusumakar
(74) Attorney, Agent, or Firm — Harness, Dickey & Pierce, P.L.C.

(57) ABSTRACT

A light emitting and receiving device having a first region and a second region adjacent to the first region in a plan view, includes: a light absorbing layer formed in the first and second regions; a first cladding layer formed above the light absorbing layer; an active layer formed above the first cladding layer in the first region; and a second cladding layer formed above the active layer, wherein at least part of the active layer forms a gain region, a stepped side surface having an end surface of the gain region is formed at the boundary between the first region and the second region, light produced in the gain region exits through the end surface of the gain region, and part of the light having exited reaches the light absorbing layer in the second region and is received by the light absorbing layer.

8 Claims, 11 Drawing Sheets

LIGHT EMITTING AND RECEIVING DEVICE

BACKGROUND

1. Technical Field

The present invention relates to a light emitting and receiving device.

2. Related Art

In a semiconductor light emitting device used in optical communication and other fields, in general, a half-silvered mirror or a diffraction element disposed external to the device extracts part of the light having exited out of the device, and the extracted light is detected by a light receiving element. The amount of light is thus adjusted or otherwise processed.

For example, JP-A-10-3691 proposes an optical pickup apparatus in which a spectroscopic prism or any other suitable component separates the light from a laser diode and a monitoring photodiode detects the separated light.

In the method disclosed in JP-A-10-3691, however, since the light emitting element and the light receiving element are separate components, the extra prism or any other suitable component is required, resulting in increase in the number of parts and difficulty in size reduction. Further, to use a display apparatus, it is necessary to detect the amounts of light from a plurality of laser diodes separately, but it is sometimes difficult to provide a light receiving element for each of the plurality of laser diodes.

SUMMARY

An advantage of some aspects of the invention is to provide a light emitting and receiving device in which a light emitting element and a light receiving element can be integrated into a monolithic structure.

According to an aspect of the invention, there is provided a light emitting and receiving device including a first region and a second region adjacent to the first region in a plan view, the light emitting and receiving device including a light absorbing layer formed in the first and second regions, a first cladding layer formed above the light absorbing layer, an active layer formed above the first cladding layer in the first region, and a second cladding layer formed above the active layer, wherein at least part of the active layer forms a gain region, a stepped side surface having an end surface of the gain region is formed at the boundary between the first region and the second region, light produced in the gain region exits through the end surface of the gain region, and part of the light having exited reaches the light absorbing layer in the second region and is received by the light absorbing layer.

According to the light emitting and receiving device described above, the active layer, which forms a light emitting element, can be formed above the light absorbing layer, which forms a light receiving element. Part of the light produced in the gain region of the active layer in the first region reaches the light absorbing layer in the second region and can be absorbed by the light absorbing layer. That is, the light emitting element and the light receiving element can be integrated into a monolithic structure.

In the description of the invention, the term "above" is used in the following manner: For example, "a specific object (hereinafter referred to as "A") is formed above another specific object (hereinafter referred to as "B"). In the example described above, the term "above" used herein includes a case where A is formed directly on B and a case where A is formed above B with another object therebetween. Similarly, the term "below" used herein includes a case where A is formed directly on B and a case where A is formed below B with another object therebetween.

The light emitting and receiving device according to the aspect of the invention may further include a first electrode formed above the first cladding layer in the second region, a contact layer formed above the second cladding layer, a second electrode formed above the contact layer, and a third electrode formed below the light absorbing layer, and the plan shape of the gain region is the same as the plan shape of the surface where the contact layer comes into contact with the second electrode, the first and second electrodes are provided to produce light in the gain region, and the first and third electrodes are provided to receive the light having reached the light absorbing layer.

According to the light emitting and receiving device described above, the contact layer can reduce the contact resistance between the second electrode and the second cladding layer.

The light emitting and receiving device according to the aspect of the invention may be configured such that, the first cladding layer in the second region has an opening, the light absorbing layer is exposed in the opening, and part of the light having exited reaches the light absorbing layer exposed in the opening and is received by the light absorbing layer.

According to the light emitting and receiving device described above, the light can be efficiently absorbed and the detection ability of the light receiving element can therefore be improved.

The light emitting and receiving device according to the aspect of the invention may be configured such that the gain region extends from the end surface on a first side of the active layer to the end surface on a second side, which is the side that is opposite to the first side, of the active layer and is oriented in a direction inclined with respect to a normal to the first side, the end surface on the first side does not overlap with the end surface on the second side in a projection viewed from the first side, and at least the end surface on the first side forms the stepped side surface.

The light emitting and receiving device described above can suppress or prevent laser oscillation of the light produced in the gain region and hence reduce the amount of speckle noise.

The light emitting and receiving device according to the aspect of the invention may be configured such that the second region is formed of two second regions, and the first region is disposed between the two second regions.

According to the light emitting and receiving device described above, since the two portions can absorb part of the exiting light, the detection ability of the light receiving element can be improved.

The light emitting and receiving device according to the aspect of the invention may be configured such that the gain region is formed of a plurality of gain regions, a separation groove is formed between adjacent ones of the gain regions, and the bottom surface of each of the separation grooves is positioned below the lower surface of the light absorbing layer.

According to the light emitting and receiving device described above, the intensity of the emitted light can be increased. Further, since any of the plurality of gain regions and the corresponding light absorbing layer are electrically separated from the other gain regions and the respective light absorbing layers by the separation grooves, the optical output from each of the plurality of gain regions can be monitored. That is, the amounts of light from the plurality of gain regions can be individually detected.

The light emitting and receiving device according to the aspect of the invention may be configured such that in the wavelength band to which the light produced in the gain region belongs, the reflectance on the second side is higher than that on the first side, the gain region is formed of a plurality of gain regions, the plurality of gain regions forms at least one pair of gain regions, a first gain region, which is one of the pair of gain regions, is oriented in one direction, a second gain region, which is the other one of the pair of gain regions, is oriented in another direction that differs from the one direction, and the end surface on the second side of the first gain region overlaps with the end surface on the second side of the second gain region.

According to the light emitting and receiving device described above, part of the light produced in the first gain region can be reflected off the overlap surface and amplified also in the second gain region while traveling therethrough. The same applies to part of the light produced in the second gain region. The optical output can therefore be increased because the length over which the optical intensity is amplified increases.

The light emitting and receiving device according to the aspect of the invention may be configured such that the pair of gain regions is formed of a plurality of pairs of gain regions, a separation groove is formed between adjacent ones of the pairs of gain regions, and the bottom surface of each of the separation grooves is positioned below the lower surface of the light absorbing layer.

According to the light emitting and receiving device described above, the intensity of the emitted light can be increased. Further, since any of the plurality of pairs of gain regions and the corresponding light absorbing layer are electrically separated from the other pairs of gain regions and the respective light absorbing layers by the separation grooves, the optical output from each of the plurality of pairs of gain regions can be monitored. That is, the amounts of light from the plurality of pairs of gain regions can be individually detected.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Figure 1:
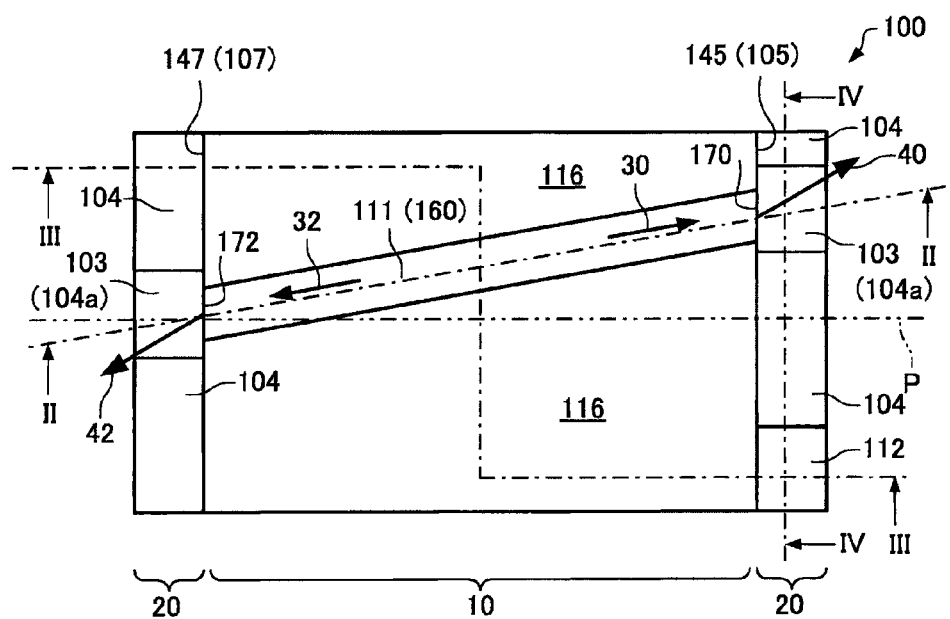
FIG. 1 is a plan view diagrammatically showing a light emitting and receiving device according to a first embodiment.
Figure 2:
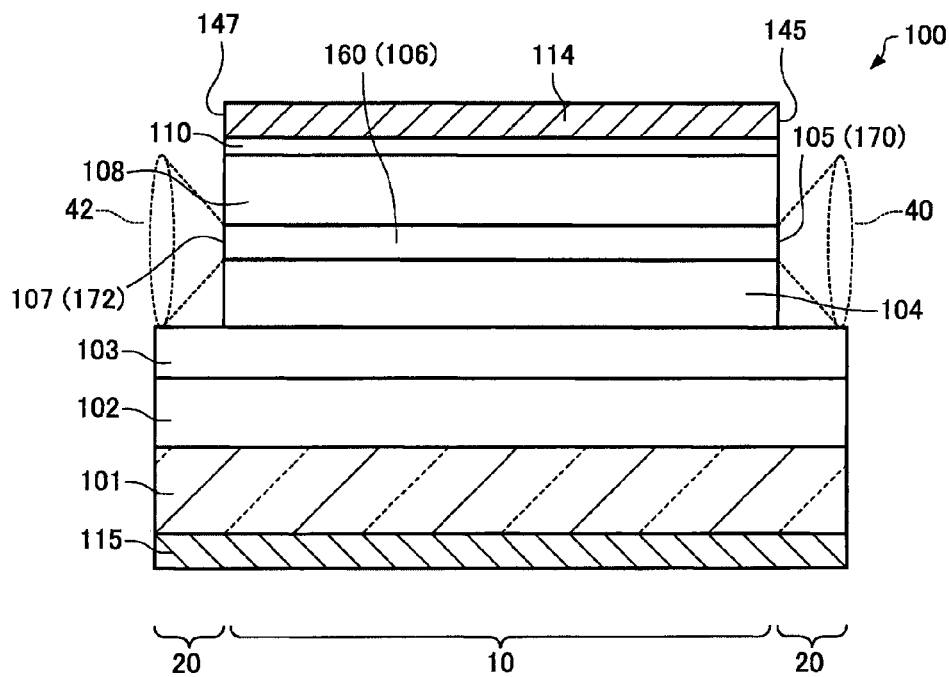
FIG. 2 is a cross-sectional view diagrammatically showing the light emitting and receiving device according to the first embodiment.

1. First Embodiment
1.1. Light Emitting and Receiving Device According to First Embodiment A light emitting and receiving device 100 according to a first embodiment will first be described with reference to the drawings. FIG. 1 is a plan view diagrammatically showing the light emitting and receiving device 100. FIG. 2 is a cross-sectional view diagrammatically showing the light emitting and receiving device 100 taken along the line II-II in FIG. 1.

Figure 3:
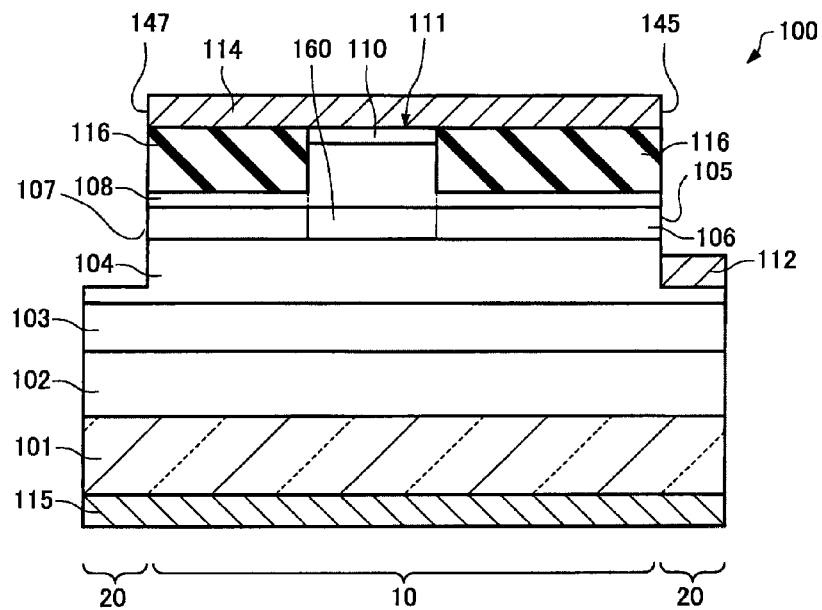
FIG. 3 is another cross-sectional view diagrammatically showing the light emitting and receiving device according to the first embodiment.
Figure 4:
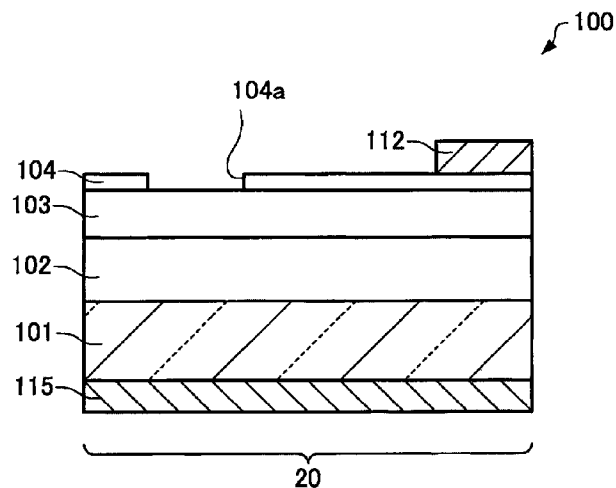
FIG. 4 is another cross-sectional view diagrammatically showing the light emitting and receiving device according to the first embodiment.

FIG. 3 is a cross-sectional view diagrammatically showing the light emitting and receiving device 100 taken along the line III-III in FIG. 1. FIG. 4 is a cross-sectional view diagrammatically showing the light emitting and receiving device 100 taken along the line IV-IV in FIG. 1. In FIG. 1, a second electrode 114 is omitted for convenience.

The configuration of the light emitting and receiving device 100, the principle of light emission, and the principle of light reception will be described below in this order.

(1) Configuration

The light emitting and receiving device 100 includes a light absorbing layer 103, a first cladding layer 104, an active later 106, and a second cladding layer 108, as shown in FIGS. 1 to 3. The light emitting and receiving device 100 can further include a substrate 101, a third cladding layer 102, a contact layer 110, a first electrode 112, a second electrode 114, a third electrode 115, and an insulator 116.

The light emitting and receiving device 100 further includes a first region 10 and a second region 20 adjacent to the first region 10 in a plan view. In the illustrated example, the substrate 101, the third cladding layer 102, the light absorbing layer 103, the first cladding layer 104, the active layer 106, the second cladding layer 108, the contact layer 110, and the insulator 116 are stacked in the first region 10. The substrate 101, the third cladding layer 102, the light absorbing layer 103, and the first cladding layer 104 are stacked in the second region 20. The number of both first regions 10 and second regions 20 is at least one. In the illustrated example, two second regions 20 are provided, and one first region 10 is disposed between the two second regions 20. The shape of each of the second regions 20 is rectangular in a plan view in the example shown in FIG. 1, but not particularly limited thereto.

As shown in FIGS. 1 to 3, stepped side surfaces 145 and 147 are formed at the boundaries between the first region 10 and each of the second regions 20. That is, the first region 10 and the second regions 20 are separated by the stepped side surfaces 145 and 147. The stepped side surfaces 145 and 147 are formed in an etching step of exposing side surfaces 105 and 107 of the active layer 106 and can be flat surfaces. In the illustrated example, the stepped side surfaces 145 and 147 are formed of the side surfaces of the first cladding layer 104, the active layer 106, the second cladding layer 108, the contact layer 110, the insulator 116, and the second electrode 114. The stepped side surface 145 can have a first end surface 170 of a gain region 160, and the stepped side surface 147 can have a second end surface 172 of the gain region 160, as shown in FIG. 2.

The substrate 101 is formed in the first region 10 and the second regions 20, as shown in FIGS. 2 and 3. The substrate 101 can, for example, be a GaAs substrate of a first conductivity type (p-type, for example).

The third cladding layer 102 is formed on the substrate 101 in the first region 10 and the second regions 20. The third cladding layer 102 can, for example, be a p-type AlGaAs layer.

The light absorbing layer 103 is formed on the third cladding layer 102 in the first region 10 and the second regions 20. The light absorbing layer 103 can, for example, be a GaAs layer. The light absorbing layer 103 can absorb part of the light produced in the gain region 160, as will be described later.

The first cladding layer 104 is formed on the light absorbing layer 103 in the first region 10 and the second regions 20. The first cladding layer 104 can, for example, be an AlGaAs layer having a second conductivity type (n-type, for example). The upper surface of the first cladding layer 104 in the first region 10 is positioned above the upper surface of the first cladding layer 104 in each of the second regions 20, as shown in FIG. 3. That is, part of the first cladding layer 104, which is the portion in each of the second regions 20, is etched in the step of exposing the side surfaces 105 and 107 of the active layer 106.

The first cladding layer 104 in each of the second regions 20 has an opening 104a, as shown in FIG. 4. The light absorbing layer 103 is exposed in each of the openings 104a. That is, the bottom surface of each of the openings 104a is the upper surface of the light absorbing layer 103. The openings 104a are adjacent to the end surfaces 170 and 172 of the gain region 160 in a plan view, as shown in FIG. 1. As a result, the light absorbing layer 103 exposed in the openings 104a can absorb part of the light having exited through the end surfaces 170 and 172. Although not illustrated, the openings 104a may not be formed, and the upper surface of the first cladding layer 104 in each of the second regions 20 may alternatively be a flat surface. In this case, part of the exiting light passes through the first cladding layer 104 in the second regions 20 and reaches the light absorbing layer 103. Although not illustrated again, in the second regions 20, the first cladding layer 104 may alternatively be provided only below the first electrode 112 but not in the other region.

The active layer 106 is formed on the first cladding layer 104 in the first region 10, as shown in FIGS. 2 and 3. The active layer 106, for example, has a multiple quantum well (MQW) structure in which three quantum well structures each of which is formed of a GaAs well layer and an AlGaAs barrier layer are stacked. The active layer 106 has, for example, a box-like shape (including a cubic shape). The active layer 106 has the first side surface 105 and the second side surface 107. The first side surface 105 and the second side surface 107 face away from each other. In the illustrated example, the first side surface 105 and the second side surface 107 are parallel to each other.

Part of the active layer 106 forms the gain region 160. The gain region 160 has the first end surface 170 provided along the first side surface 105 and the second end surface 172 provided along the second side surface 107, as shown in FIGS. 1 and 2. The shape of the gain region 160 in a plan view is, for example, a parallelogram, as shown in FIG. 1. In the illustrated example, one gain region 160 is provided in a linear portion between the first end surface 170 and the second end surface 172 and oriented in a direction inclined with respect to a normal P to the first side surface 105. The shape of the gain region 160 suppresses or prevents laser oscillation of light produced therein.

Although not illustrated, an anti-reflection film may be provided on each of the stepped side surfaces 145 and 147 including the side surfaces 105 and 107. The anti-reflection film can, for example, be a dielectric multilayer film mirror obtained by stacking 10 pairs each of which is formed of an $SiO_2$ layer and a $Ta_2O_5$ layer placed in this order from the side where the side surface 105 or 107 is present. The anti-reflection film allows light 40 and 42 to exit efficiently. The anti-reflection film may alternatively be provided in each of the openings 104a.

Figure 5:
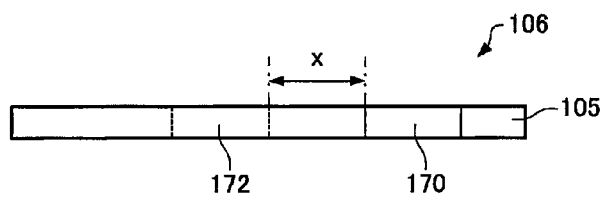
FIG. 5 is a projection of an active layer in the light emitting and receiving device according to the first embodiment when viewed from a first side surface of the active layer.

FIG. 5 is a projection of the active layer 106 viewed from the first side surface 105. As shown in FIG. 5, the first end surface 170 does not overlap with the second end surface 172. That is, the deviation x between the first end surface 170 and the second end surface 172 is a positive value. The shape of the active layer 106 prevents light produced in the gain region 160 from being directly reflected multiple times between the first end surface 170 and the second end surface 172. As a result, the configuration in which no direct resonator is formed suppresses or prevents laser oscillation of the light produced in the gain region 160 in a more reliable manner. The light emitting and receiving device 100 can therefore emit light that is not laser light.

Although not illustrated, the gain region 160 may alternatively be provided in a linear portion between the first end surface 170 and the second end surface 172 and oriented in the direction parallel to the normal P to the first side surface 105. That is, the first end surface 170 may completely overlap with the second end surface 172 in a projection of the active layer 106 viewed from the first side surface 105. In this case, a resonator is formed, and the light emitting and receiving device 100 can emit laser light.

The second cladding layer 108 is formed on the active layer 106 in the first region 10, as shown in FIGS. 2 and 3. The second cladding layer 108 can, for example, be a p-type AlGaAs layer.

The contact layer 110 is formed on the second cladding layer 108 in the first region 10. The contact layer 110 can be a layer that allows ohmic contact with the second electrode 114. The contact layer 110 can reduce contact resistance between the second cladding layer 108 and the second electrode 114. The contact layer 110 can, for example, be a p-type GaAs layer. The contact layer 110 and part of the second cladding layer 108 can form a column-shaped portion 111, as shown in FIG. 3. The column-shaped portion 111 and the gain region 160 have the same shape in a plan view as shown, for example, in FIG. 1. That is, for example, the shape of the column-shaped portion 111 in a plan view determines a current path between the electrodes 112 and 114 and hence the shape of the gain region 160 in a plan view. Although not illustrated, the column-shaped portion 111 may alternatively be formed, for example, of the contact layer 110, the second cladding layer 108, and the active layer 106, or may further include the first cladding layer 104. Further, the side surfaces of the column-shaped portion 111 may be inclined.

The insulator 116 is formed on both sides of the column-shaped portion 111 on the second cladding layer 108 in the first region 10, as shown in FIG. 3. Each of the insulators 116 can be in contact with the corresponding side surface of the column-shaped portion 111. The upper surface of each of the insulators 116 can, for example, be flush with the upper surface of the contact layer 110. Each of the insulators 116 can, for example, be an SiN layer, an $SiO_2$ layer, or a polyimide layer. When the insulators 116 are made of any of the materials described above, the current between the electrodes 112 and 114 can flow through the column-shaped portion 111 sandwiched between the insulators 116 but not therethrough. The refractive index of the insulators 116 can be smaller than that of the active layer 106. In this case, the effective refractive index along a vertical cross section of the portion where the insulators 116 are formed is smaller than the effective refractive index along a vertical cross section of the portion where no insulators 116 are formed, that is, the portion where the column-shaped portion 111 is formed. As a result, light can be efficiently trapped in the gain region 160 in the horizontal direction.

The first electrode 112 is formed on the first cladding layer 104 in one of the second regions 20, as shown in FIGS. 1 and 3 and the description below. In the illustrated example, the first electrode 112 is provided in the second region 20 on the side where the first side surface 105 is present. The first electrode 112 is disposed not to be adjacent to the first end surface 170 in a plan view, as shown in FIG. 1. That is, the first electrode 112 is disposed not to block the light having exited through the first end surface 170. The first electrode 112 is not only one of the electrodes for producing light in the gain region 160 but also one of the electrodes for receiving the light having reached the light absorbing layer 103. That is, the first electrode 112 can function as an electrode for light emission and an electrode for light reception. The first electrode 112 can, for example, be a Cr layer, an AuGe layer, an Ni layer, and an Au layer stacked in this order on the first cladding layer 104. The shape of the first electrode 112 in a plan view is not particularly limited. For example, although not illustrated, part of one of the second regions 20 may protrude into the first region 10, and the first electrode 112 may be provided in the protruding portion. In this way, the area of the first electrode 112 can be increased, whereby the electric resistance of the first electrode 112 can be reduced.

The second electrode 114 is formed on the contact layer 110 (column-shaped portion 111) and the insulators 116, as shown in FIGS. 2 and 3. The surface where the second electrode 114 comes into contact with the contact layer 110 has the same shape in a plan view as that of the gain region 160. Although not illustrated, the second electrode 114 may not be formed on the insulators 116 but only on the contact layer 110. The second electrode 114 is electrically connected to the second cladding layer 108 via the contact layer 110. The second electrode 114 is the other one of the electrodes (electrodes for light emission) for producing light in the gain region 160. The second electrode 114 can, for example, be a Cr layer, an AuZn layer, and an Au layer stacked in this order on the contact layer 110.

The third electrode 115 is formed over the lower surface of the substrate 101. The third electrode 115 can be in contact with a layer that allows ohmic contact with the third electrode 115 (the substrate 101 in the illustrated example). The third electrode 115 is electrically connected to the third cladding layer 102 via the substrate 101. The third electrode 115 is the other one of the electrodes (electrodes for light reception) for receiving part of the light produced in the gain region 160. The third electrode 115 can, for example, be a Cr layer, an AuZn layer, and an Au layer stacked in this order on the substrate 101.

(2) Principle of Light Emission

The p-type second cladding layer 108, the active layer 106 to which no impurity is doped, and the n-type first cladding layer 104 can form a pin diode. Each of the first cladding layer 104 and the second cladding layer 108 is a layer having a wider band gap and a smaller refractive index than those of the active layer 106. The active layer 106 has a function of light amplification, and the first cladding layer 104 and the second cladding layer 108, which sandwich the active layer 106, has a function of trapping injected carriers (electrons and holes) and light.

In the light emitting and receiving device 100, when a forward bias voltage at which the pin diode works is applied between the first electrode 112 and the second electrode 114, electrons are recombined with holes in the gain region 160 of the active layer 106. The recombination leads to light emission. The produced light triggers stimulated emission in a chain reaction, whereby the intensity of the light is amplified in the gain region 160. For example, light 30, which is part of the light produced in the gain region 160 and directed toward the first end surface 170, can be amplified in the gain region 160 and exit through the first end surface 170 as the light 40, as shown in FIG. 1. Similarly, light 32, which is part of the light produced in the gain region 160 and directed toward the second end surface 172, can be amplified in the gain region 160 and exit through the second end surface 172 as the light 42. That is, the first and second end surfaces 170 and 172 can be light-exiting surfaces.

As described above, the light emitting and receiving device 100 can form a pin diode for light emission. That is, the light emitting and receiving device 100 can form a light emitting element formed of the first cladding layer 104, the active layer 106, the second cladding layer 108, the first electrode 112, and the second electrode 114.

(3) Principle of Light Reception

The p-type third cladding layer 102, the light absorbing layer 103 to which no impurity is doped, and the n-type first cladding layer 104 can form a pin diode. Each of the first cladding layer 104 and the third cladding layer 102 is a layer having a wider band gap and a smaller refractive index than those of the light absorbing layer 103. The light absorbing layer 103 has a function of absorbing light, and the first cladding layer 104 and the third cladding layer 102, which sandwich the light absorbing layer 103, have a function of trapping light.

The light 40 and 42 having exited through the end surfaces 170 and 172 diverge in the vertical direction, and part of the light 40 and 42 reaches the upper surface of the light absorbing layer 103, as shown in FIG. 2. That is, the width of each of the second regions 20 (the length thereof in the direction from the first side surface 105 toward the second side surface 107) is designed to be approximately longer than or equal to the length over which part of the light 40 and 42 having exited through the end surfaces 170 and 172 travels to reach the upper surface of the light absorbing layer 103. The light having reached the light absorbing layer 103 produces electrons and holes in the light absorbing layer 103. When a reverse bias voltage at which the pin diode works is applied between the first electrode 112 and the third electrode 115, the electron-hole pairs produced by part of the light 40 and 42 in the light absorbing layer 103 can be accelerated and extracted as a current. Further, the first cladding layer 104 and the third cladding layer 102 suppress or prevent the light leaking from the light absorbing layer 103, allowing the light to be efficiently absorbed.

As described above, the light emitting and receiving device 100 can form a pin photodiode for light reception. That is, the light emitting and receiving device 100 can form a light receiving element formed of the first cladding layer 104, the third cladding layer 102, the light absorbing layer 103, the first electrode 112, and the third electrode 115.

The light emitting and receiving device 100 according to the present embodiment has been described with reference to the case where a GaAs-based material is used by way of example, but the light emitting and receiving device 100 can alternatively be made of any material that can form a region where emitted light is amplified. Exemplary useable semiconductor materials may include InGaAlP-based, AlGaN-based, InGaN-based, InGaAs-based, GaInNAs-based, and ZnCdSe-based semiconductor materials.

The light emitting and receiving device 100 according to the present embodiment can be used as a light source in a projector, a display, an illumination apparatus, a measurement instrument, and other similar apparatus.

The light emitting and receiving device 100 according to the present embodiment, for example, has the following features:

According to the light emitting and receiving device 100, the active layer 106, which forms the light emitting element, can be formed above the light absorbing layer 103, which forms the light receiving element. Part of the light produced in the gain region 160 of the active layer 106 in the first region 10 reaches the light absorbing layer 103 in the second regions 20 and can be received by the light absorbing layer 103. That is, in the light emitting and receiving device 100, the light emitting element and the light receiving element can be integrated into a monolithic structure. The monolithic structure can, for example, reduce the number of parts and the manufacturing cost, as compared with a case where a light receiving element is separately disposed.

According to the light emitting and receiving device 100, the optical output from the gain region 160 can be monitored by receiving part of the light produced in the gain region 160. The voltage applied between the first electrode 112 and the second electrode 114 can therefore be adjusted based on the monitored optical output. As a result, the light emitting and receiving device 100 allows the degree of unevenness in luminance to be reduced and the brightness to be automatically adjusted. Feedback control in which the optical output from the gain region 160 is fed back to the applied voltage can be performed, for example, by using an external electronic circuit (not illustrated).

According to the light emitting and receiving device 100, the amount of light to be received can be adjusted by changing the width of the second regions 20. For example, the wider the second regions 20 is, the larger the amount of light absorbed by the light absorbing layer 103 becomes. That is, the amount of light to be received can readily be adjusted only by changing the width of the second regions 20 in the light emitting and receiving device 100.

According to the light emitting and receiving device 100, the light absorbing layer 103 exposed in the openings 104a can absorb part of the light having exited through the end surfaces 170 and 172. As a result, in the emitting and receiving device 100, the light can be efficiently absorbed and the detection ability of the light receiving element can therefore be improved. For example, if no opening is provided, part of the light may be reflected off the upper surface of the first cladding layer, resulting in inefficient light absorption in some cases.

According to the light emitting and receiving device 100, the gain region 160 can be oriented in a direction inclined with respect to the normal P to the first side surface 105. Further, the gain region 160 can be configured in such a way that the first end surface 170 does not overlap with the second end surface 172 in a projection viewed from the first side surface 105. The structure suppresses or prevents laser oscillation of the light produced in the gain region 160, as described above. The amount of speckle noise can therefore be reduced. Further, in the light emitting and receiving device 100, the light produced in the gain region 160 can be amplified while traveling therethrough and then exit out of the light emitting and receiving device 100. The resultant output can therefore be higher than that obtained in a typical LED (Light Emitting Diode) of related art. As described above, in the light emitting and receiving device 100, the amount of speckle noise can be reduced and the output can be increased.

According to the light emitting and receiving device 100, two second regions 20 can be provided, and one first region 10 can be disposed between the two second regions 20. Since the two portions can therefore absorb part of the exiting light, the detection ability of the light receiving element can be improved in the light emitting and receiving device 100.

1.2. Method for Manufacturing Light Emitting and Receiving Device According to First Embodiment A method for manufacturing the light emitting and receiving device 100 according to the first embodiment will be described with reference to the drawings. FIGS. 6 to 13 are cross-sectional views diagrammatically showing the steps of manufacturing the light emitting and receiving device 100. FIGS. 6 to 13 correspond to FIG. 3.

Figure 6:
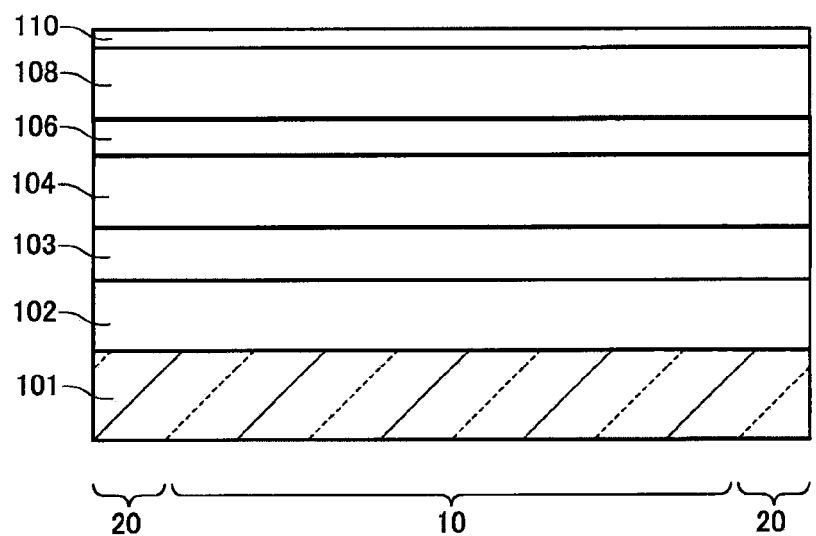
FIG. 6 is a cross-sectional view diagrammatically showing a step of manufacturing the light emitting and receiving device according to the first embodiment.

As shown in FIG. 6, the third cladding layer 102, the light absorbing layer 103, the first cladding layer 104, the active layer 106, the second cladding layer 108, and the contact layer 110 are formed in this order on the substrate 101 in an epitaxial growth process. Exemplary methods for performing the epitaxial growth may include MOCVD (Metal Organic Chemical Vapor Deposition) and MBE (Molecular Beam Epitaxy).

Figure 7:
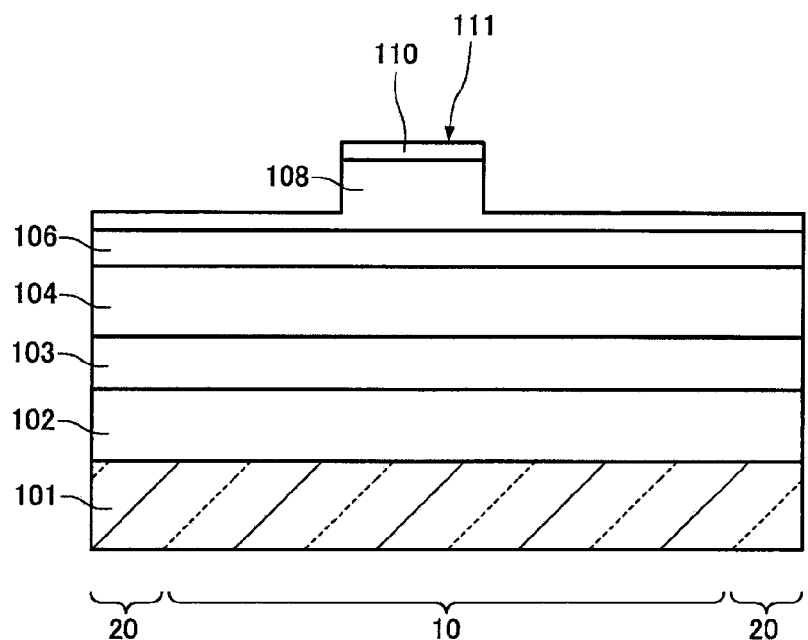
FIG. 7 is a cross-sectional view diagrammatically showing another step of manufacturing the light emitting and receiving device according to the first embodiment.

The contact layer 110 and the second cladding layer 108 are patterned, as shown in FIG. 7. The patterning is carried out not to expose the upper surface of the active layer 106. The patterning is carried out, for example, by using photolithography and etching techniques. The column-shaped portion 111 can be formed in the present manufacturing step.

Figure 8:
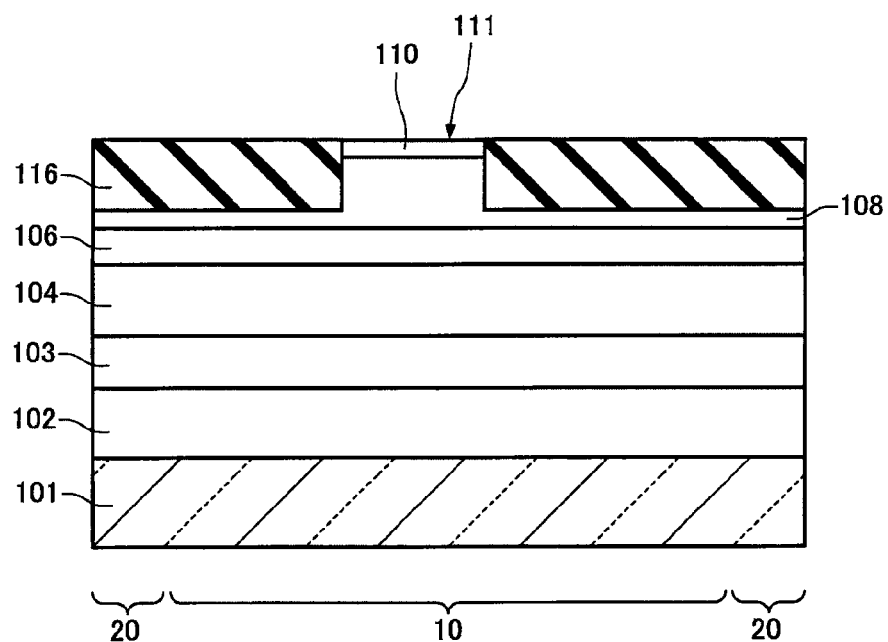
FIG. 8 is a cross-sectional view diagrammatically showing another step of manufacturing the light emitting and receiving device according to the first embodiment.

The insulators 116 are formed to cover the side surfaces of the column-shaped portion 111, as shown in FIG. 8. Specifically, CVD (Chemical Vapor Deposition), coating, or any other suitable technique is first used to deposit an insulating layer (not illustrated) in a portion above the second cladding layer 108 (including the portion on the contact layer 110). Thereafter, etching or any other suitable technique is used to expose the upper surface of the contact layer 110. The insulators 116 can be formed by carrying out the manufacturing steps described above.

Figure 9:
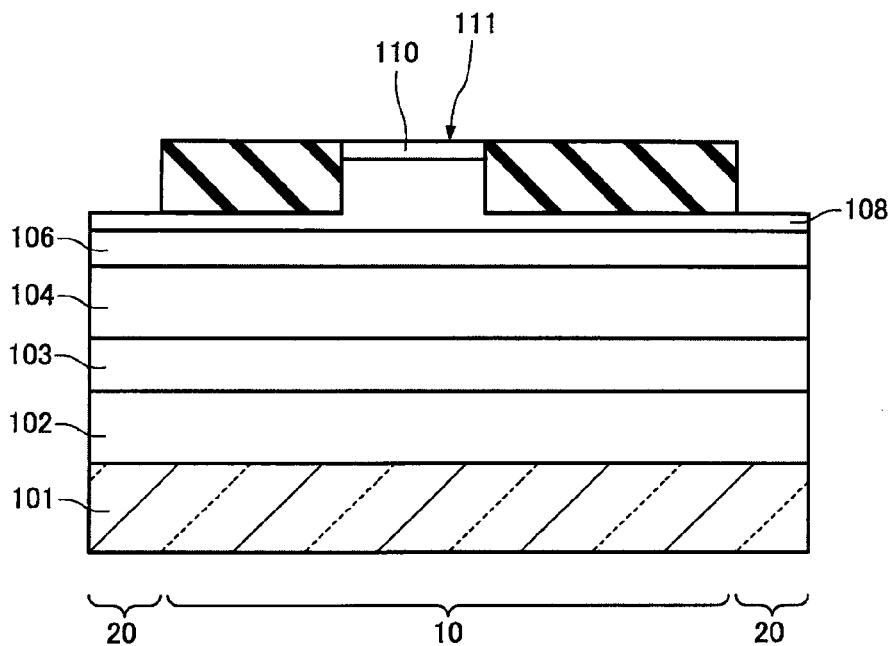
FIG. 9 is a cross-sectional view diagrammatically showing another step of manufacturing the light emitting and receiving device according to the first embodiment.

The insulators 116 are patterned, as shown in FIG. 9. More specifically, the insulators 116 in the second regions 20 are etched so that the upper surface of the second cladding layer 108 is exposed. The patterning is carried out, for example, by using photolithography and etching techniques.

Figure 10:
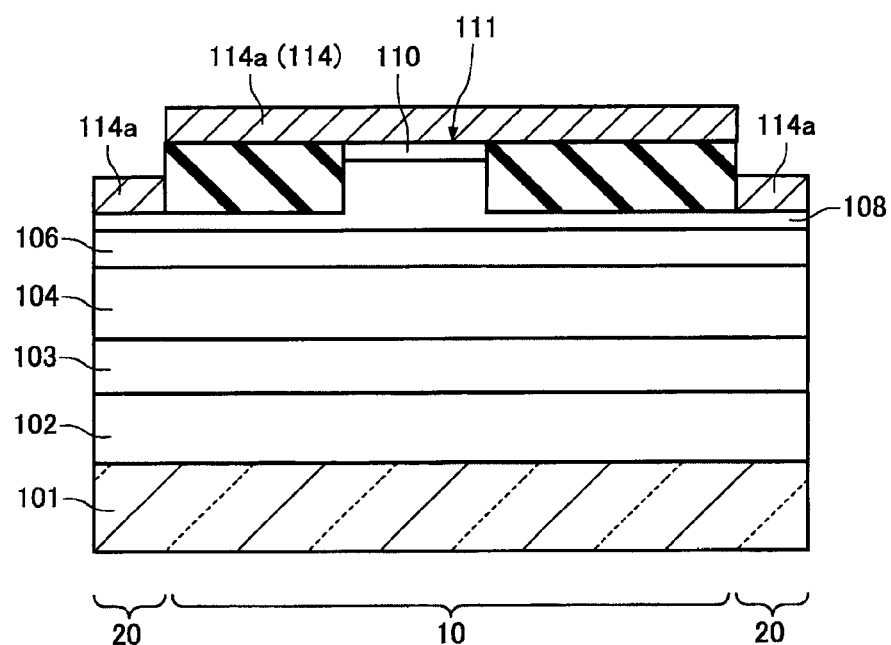
FIG. 10 is a cross-sectional view diagrammatically showing another step of manufacturing the light emitting and receiving device according to the first embodiment.

A conductive layer 114a is formed over the entire surface, as shown in FIG. 10. The conductive layer 114a on the contact layer 110 and the insulators 116 (the conductive layer 114a in the first region 10) forms the second electrode 114. The conductive layer 114a is formed, for example, by vacuum deposition.

Figure 11:
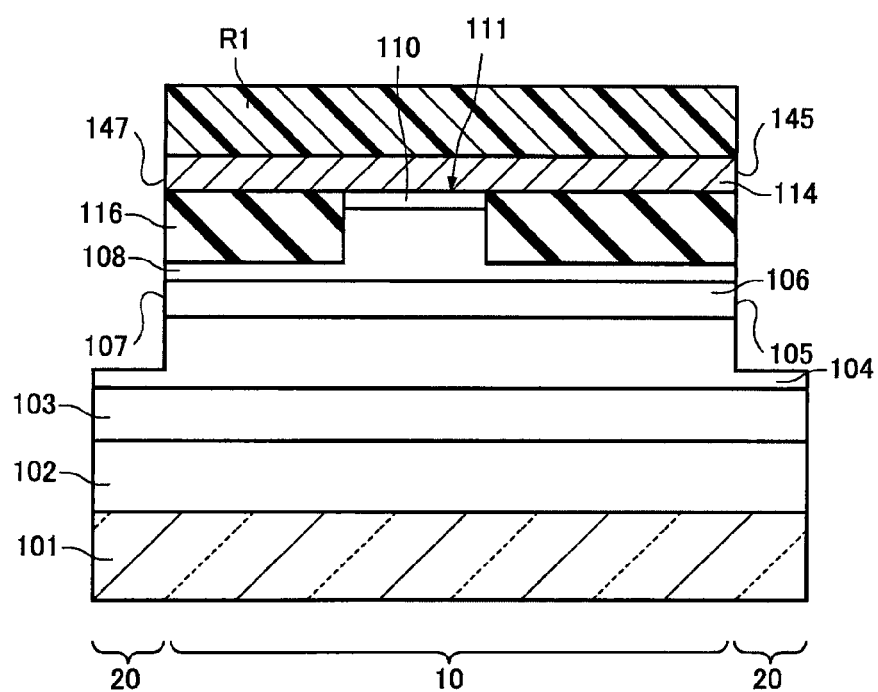
FIG. 11 is a cross-sectional view diagrammatically showing another step of manufacturing the light emitting and receiving device according to the first embodiment.

A resist R1 is formed on the second electrode 114, as shown in FIG. 11. The resist R1 is then used as a mask to etch the conductive layer 114a, the second cladding layer 108, the active layer 106, and the first cladding layer 104 in the second regions 20. The etching is carried out not to expose the upper surface of the light absorbing layer 103. The etching exposes the side surfaces 105 and 107 of the active layer 106, and the stepped side surfaces 145 and 147 are formed at the boundaries between the first region 10 and each of the second regions 20. The resist R1 is then removed. The openings 104a can then be formed in a patterning process, as shown in FIG. 4.

Figure 12:
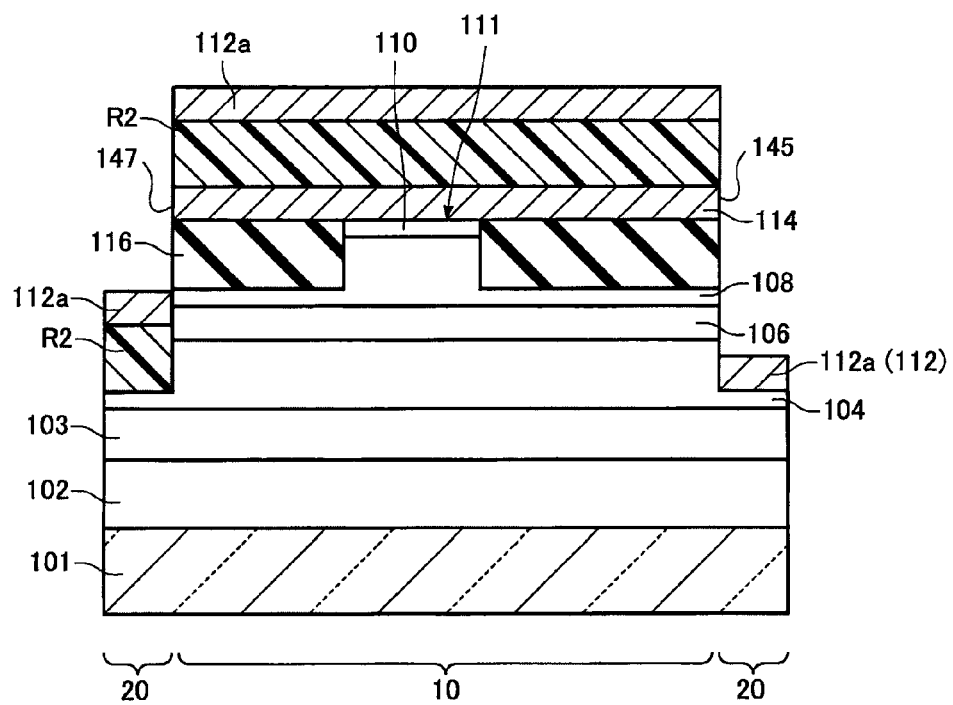
FIG. 12 is a cross-sectional view diagrammatically showing another step of manufacturing the light emitting and receiving device according to the first embodiment.

A resist R2 is formed in the region other than the region where the first electrode 112 will be formed, as shown in FIG. 12. A conductive layer 112a is then formed over the entire surface. The conductive layer 112a on the first cladding layer 104 forms the first electrode 112. The conductive layer 112a is formed, for example, by vacuum deposition.

Figure 13:
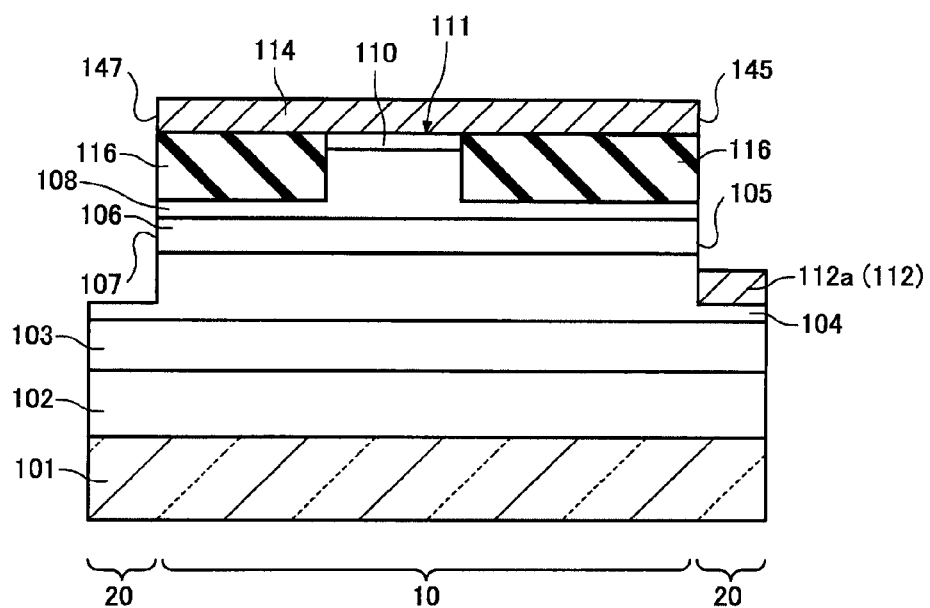
FIG. 13 is a cross-sectional view diagrammatically showing another step of manufacturing the light emitting and receiving device according to the first embodiment.

The conductive layer 112a on the resist R2 is lifted off by removing the resist R2, as shown in FIG. 13. The lifting off is carried out by a known method in the art.

The third electrode 115 is formed on the lower surface of the substrate 101, as shown in FIG. 3. The third electrode 115 is formed, for example, by vacuum deposition. Although not illustrated, an anti-reflection film may be formed on each of the stepped side surfaces 145 and 147. The anti-reflection film can be formed, for example, by CVD, sputtering, or ion assisted deposition.

The light emitting and receiving device 100 can be manufactured by carrying out the manufacturing steps described above.

According to the method for manufacturing the light emitting and receiving device 100, the stepped side surfaces 145 and 147 can be formed in an etching process. That is, the end surfaces 170 and 172 of the gain region 160, which form light-exiting surfaces, can be formed in an etching process. The positional precision at which the light-exiting surfaces are formed can therefore be improved, as compared with a case where the light-exiting surfaces are formed, for example, by cleavage. The anti-reflection film can also be readily formed.

Figure 14:
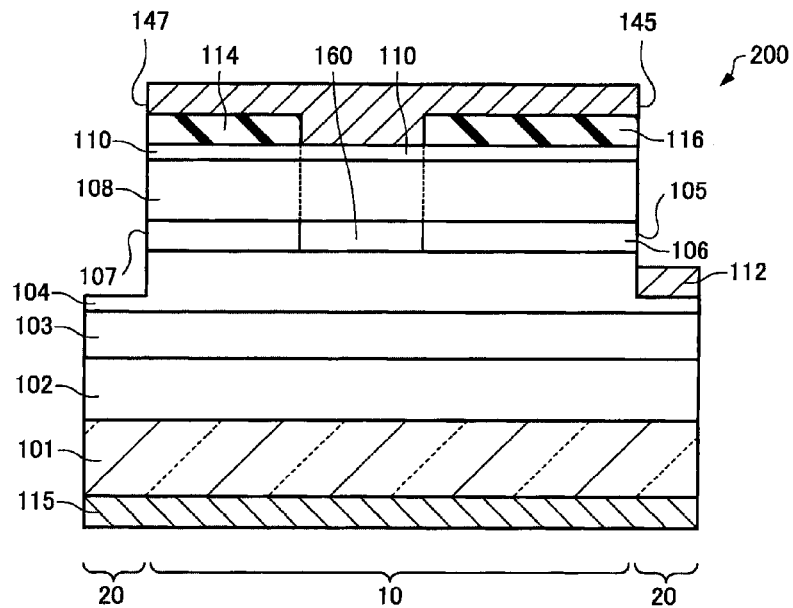
FIG. 14 is a cross-sectional view diagrammatically showing a light emitting and receiving device according to a first variation of the first embodiment.

1.3. Light Emitting and Receiving Device According to First Variation of First Embodiment A light emitting and receiving device 200 according to a first variation of the first embodiment will be described with reference to the drawings. FIG. 14 is a cross-sectional view diagrammatically showing the light emitting and receiving device 200 and corresponds to FIG. 3 diagrammatically showing the light emitting and receiving device 100. In the light emitting and receiving device 200 according to the first variation of the first embodiment, the members having functions that are the same as those of the components of the light emitting and receiving device 100 according to the first embodiment have the same reference characters, and no detailed description of these members will be made below.

The light emitting and receiving device 100 has been described by way of example with reference to a refractive index guided light emitting and receiving device in which light is trapped by providing difference in refractive index between the insulators 116 and the region where no insulator 116 is formed, that is, the region where the column-shaped portion 111 is formed. In contrast, the light emitting and receiving device 200 can be a gain guided light emitting and receiving device in which the difference in refractive index by the formation of the column-shaped portion 111 is not provided but the gain region 160 directly forms a light guide region.

That is, in the light emitting and receiving device 200, the contact layer 110 and the second cladding layer 108 form no column-shaped portion and no insulators 116 are formed on both sides thereof, as shown in FIG. 14. The insulator 116 is formed on the contact layer 110 except the portion above the gain region 160. That is, the insulator 116 has an opening located above the gain region 160, and the upper surface of the contact layer 110 is exposed in the opening. The second electrode 114 is formed on the exposed contact layer 110 and the insulator 116. The surface where the second electrode 114 comes into contact with the contact layer 110 has the same plan shape as that of the gain region 160. In the illustrated example, the plan shape of the surface where the second electrode 114 comes into contact with the contact layer 110 can determine the current path between the electrodes 112 and 114 and hence the plan shape of the gain region 160. Although not illustrated, the second electrode 114 may not be formed on the insulator 116, but may be formed only on the contact layer 110 above the gain region 160.

According to the light emitting and receiving device 200, the light emitting element and the light receiving element can be integrated into a monolithic structure, as in the light emitting and receiving device 100.

Figure 15:
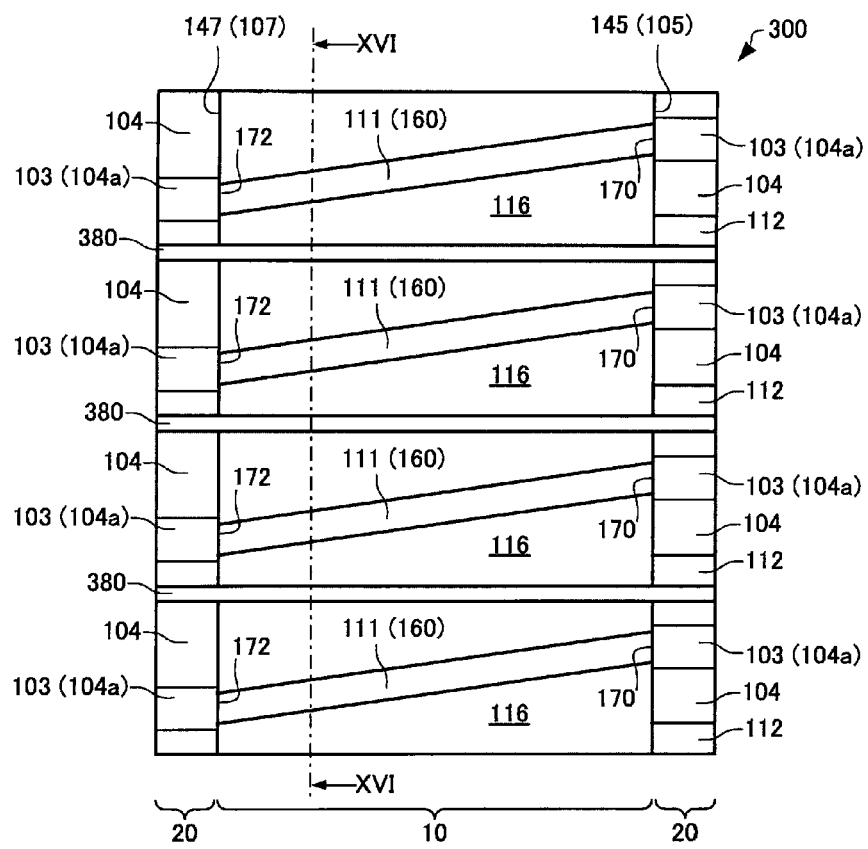
FIG. 15 is a plan view diagrammatically showing a light emitting and receiving device according to a second variation of the first embodiment.
Figure 16:
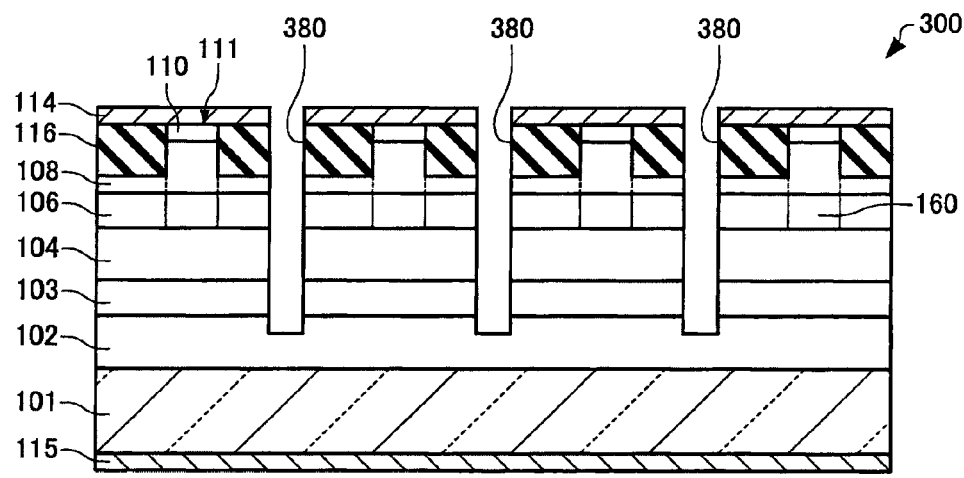
FIG. 16 is a cross-sectional view diagrammatically showing the light emitting and receiving device according to the second variation of the first embodiment.

1.4. Light Emitting and Receiving Device According to Second Variation of First Embodiment A light emitting and receiving device 300 according to a second variation of the first embodiment will be described with reference to the drawings. FIG. 15 is a plan view diagrammatically showing the light emitting and receiving device 300. FIG. 16 is a cross-sectional view diagrammatically showing the light emitting and receiving device 300 taken along the line XVI-XVI in FIG. 15. In FIG. 15, the second electrode 114 is omitted for convenience. In the light emitting and receiving device 300 according to the second variation of the first embodiment, the members having functions that are the same as those of the components of the light emitting and receiving device 100 according to the first embodiment have the same reference characters, and no detailed description of these members will be made below.

In the light emitting and receiving device 300, a plurality of gain regions 160 are arranged, as shown in FIGS. 15 and 16. A plurality of first electrodes 112 are provided in correspondence with the plurality of gain regions 160. A separation groove 380 is formed between adjacent ones of the gain regions 160. It can also be said that the separation groove 380 is formed between adjacent ones of the first electrodes 112. The bottom surface of each of the separation grooves 380 is positioned below the lower surface of the light absorbing layer 103, as shown in FIG. 16. In the illustrated example, the bottom surface of each of the separation grooves 380 is positioned between the upper and lower surfaces of the third cladding layer 102. The separation grooves 380 are formed, for example, by using photolithography and etching techniques.

According to the light emitting and receiving device 300, the intensity of the emitted light can be higher than that in the light emitting and receiving device 100. Further, according to the light emitting and receiving device 300, any of the plurality of gain regions 160 and the corresponding light absorbing layer 103 are electrically separated from the other gain regions 160 and the respective light absorbing layers 103 by the separation grooves 380. The optical output from each of the plurality of gain regions 160 can therefore be monitored. That is, the amounts of light from the plurality of gain regions 160 can be individually detected.

Figure 17:
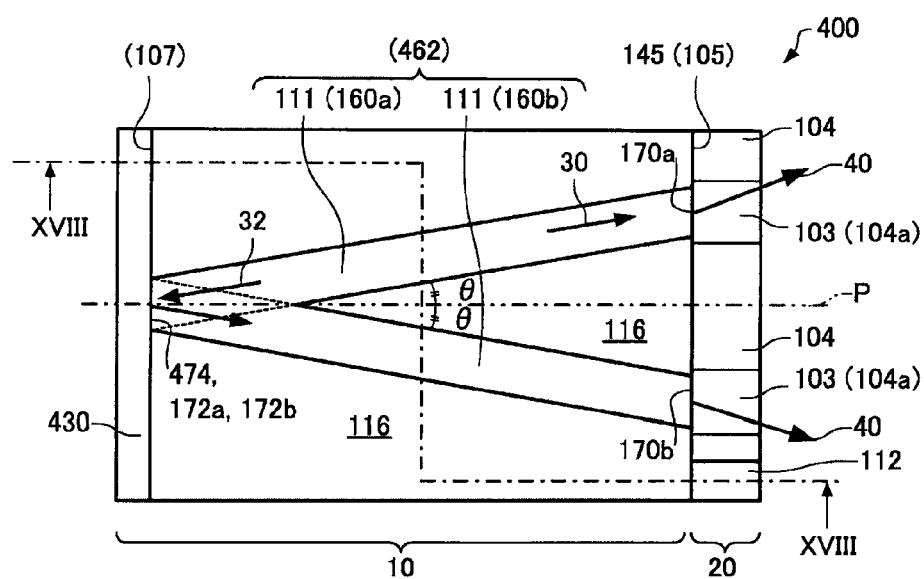
FIG. 17 is a plan view diagrammatically showing a light emitting and receiving device according to a second embodiment.
Figure 18:
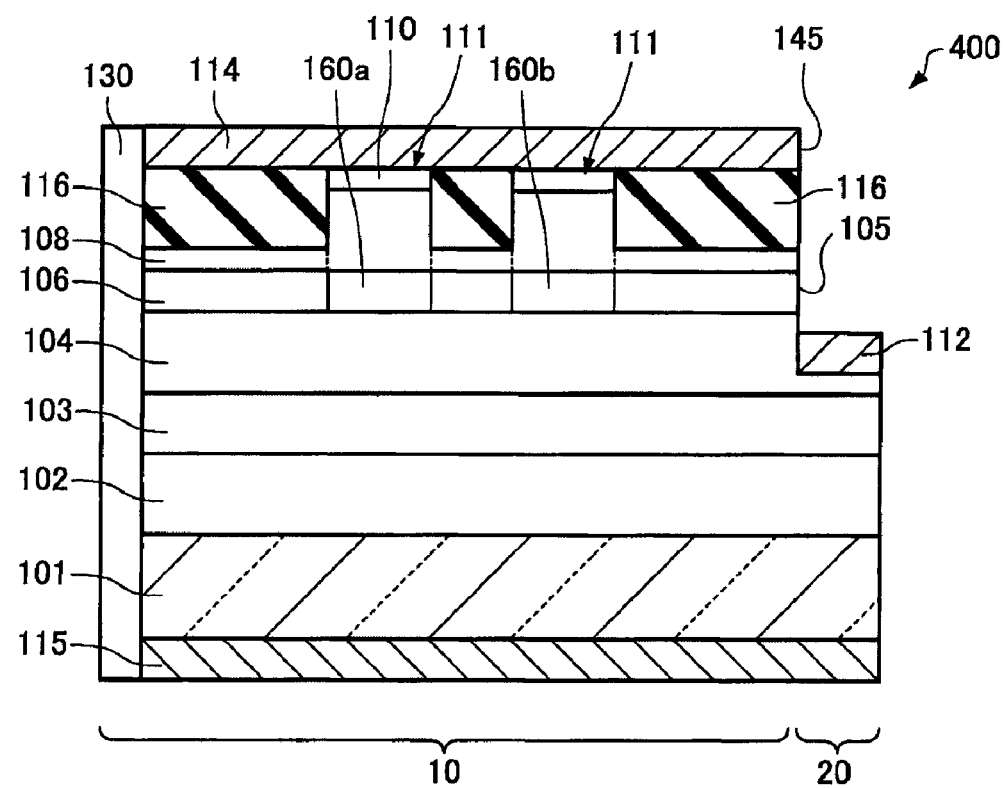
FIG. 18 is a cross-sectional view diagrammatically showing the light emitting and receiving device according to the second embodiment.

2. Second Embodiment 2.1. Light Emitting and Receiving Device According to Second Embodiment A light emitting and receiving device 400 according to a second embodiment will be described with reference to the drawings. FIG. 17 is a plan view diagrammatically showing the light emitting and receiving device 400. FIG. 18 is a cross-sectional view diagrammatically showing the light emitting and receiving device 400 taken along the line XVIII-XVIII in FIG. 17. In FIG. 17, the second electrode 114 is omitted for convenience. In the light emitting and receiving device 400 according to the second embodiment, the members having functions that are the same as those of the components of the light emitting and receiving device 100 according to the first embodiment have the same reference characters, and no detailed description of these members will be made below.

In the case of the light emitting and receiving device 100, two second regions 20 are provided, and one first region 10 is disposed between the two second regions 20. In contrast, in the light emitting and receiving device 400, a second region 20 is provided on the side where the first side surface 105 is present, but no second region 20 is provided on the side where the second side surface 107 is present, as shown in FIG. 17. That is, the light emitting and receiving device 400 has one stepped side surface 145.

The light emitting and receiving device 400 includes a plurality of gain regions 160 (first gain region 160a and second gain region 160b), which forms a pair of gain regions 462. The first gain region 160a has a first end surface 170a provided along the first side surface 105 and a second end surface 172a provided along the second side surface 107. The second gain region 160b has a first end surface 170b provided along the first side surface 105 and a second end surface 172b provided along the second side surface 107. The first gain region 160a and the second gain region 160b are oriented in different directions. In the illustrated example, the first gain region 160a is inclined to one side away from the normal P to the first side surface 105 and oriented in one direction having an inclination angle θ. The second gain region 160b is inclined to the other side (the side opposite to the one side) away from the normal P and oriented in the other direction having the inclination angle θ. In the illustrated example, the second end surface 172a of the first gain region 160a completely overlaps with the second end surface 172b of the second gain region 160b along an overlap surface 474. The first gain region 160a and the second gain region 160b are in line symmetry about the normal P passing through the center of the overlap surface 474 in a plan view, for example, shown in FIG. 17.

In the wavelength band to which the light produced in the gain regions 160a and 160b belongs, the reflectance of the second side surface 107 is higher than that of the first side surface 105. The reflectance can be increased, for example, by covering the second side surface 107 with a reflective film 430, as shown in FIGS. 17 and 18. The reflective film 430 is, for example, a dielectric multilayer film mirror. Specifically, the reflective film 430 can be a mirror obtained by stacking 10 pairs each of which is formed of an $SiO_2$ layer and a $Ta_2O_5$ layer placed in this order from the side where the second side surface 107 is present. The reflectance of the second side surface 107 is desirably 100% or close thereto. In contrast, the reflectance of the first side surface 105 is desirably 0% or close thereto. The reflectance can be lowered, for example, by covering the first side surface 105 with an anti-reflection film (not illustrated). That is, in the light emitting and receiving device 400, the first end surfaces 170a and 170b form light-exiting surfaces, and the second end surfaces 172a and 172b form a reflective surface. The reflective film 430 is not limited to the example described above, but can, for example, be an $Al_2O_3$ layer, a $TiO_2$ layer, an SiN layer, or a multilayer formed thereof. The reflective film 430 can be formed, for example, by CVD, sputtering, or ion assisted deposition.

As shown in FIG. 17, for example, part 32 of the light produced in the first gain region 160a is amplified not only in the first gain region 160a but also in the second gain region 160b after reflected off the overlap surface 474, and exits through the first end surface 170b of the second gain region 160b as exiting light 40. Similarly, part of the light produced in the second gain region 160b is amplified not only in the second gain region 160b but also in the first gain region 160a after reflected off the overlap surface 474, and exits through the first end surface 170a of the first gain region 160a as exiting light 40. It is noted that another part of the light produced in the first gain region 160a directly exits through the first end surface 170a of the first gain region 160a as the exiting light 40. Similarly, another part of the light produced in the second gain region 160b directly exits through the first end surface 170b of the second gain region 160b as the exiting light 40. The other parts of light described above are also amplified in the respective gain regions 160a and 160b.

According to the light emitting and receiving device 400, the part 32 of the light produced in the first gain region 160a is reflected off the overlap surface 474 and amplified also in the second gain region 160b while traveling therethrough, as described above. The same applies to part of the light produced in the second gain region 160b. Therefore, the light emitting and receiving device 400 can provide a higher optical output than that provided in a case where, for example, the overlap surface 474 is not intentionally used to reflect the light produced in the gain regions, because the distance over which the optical intensity is amplified increases.

Figure 19:
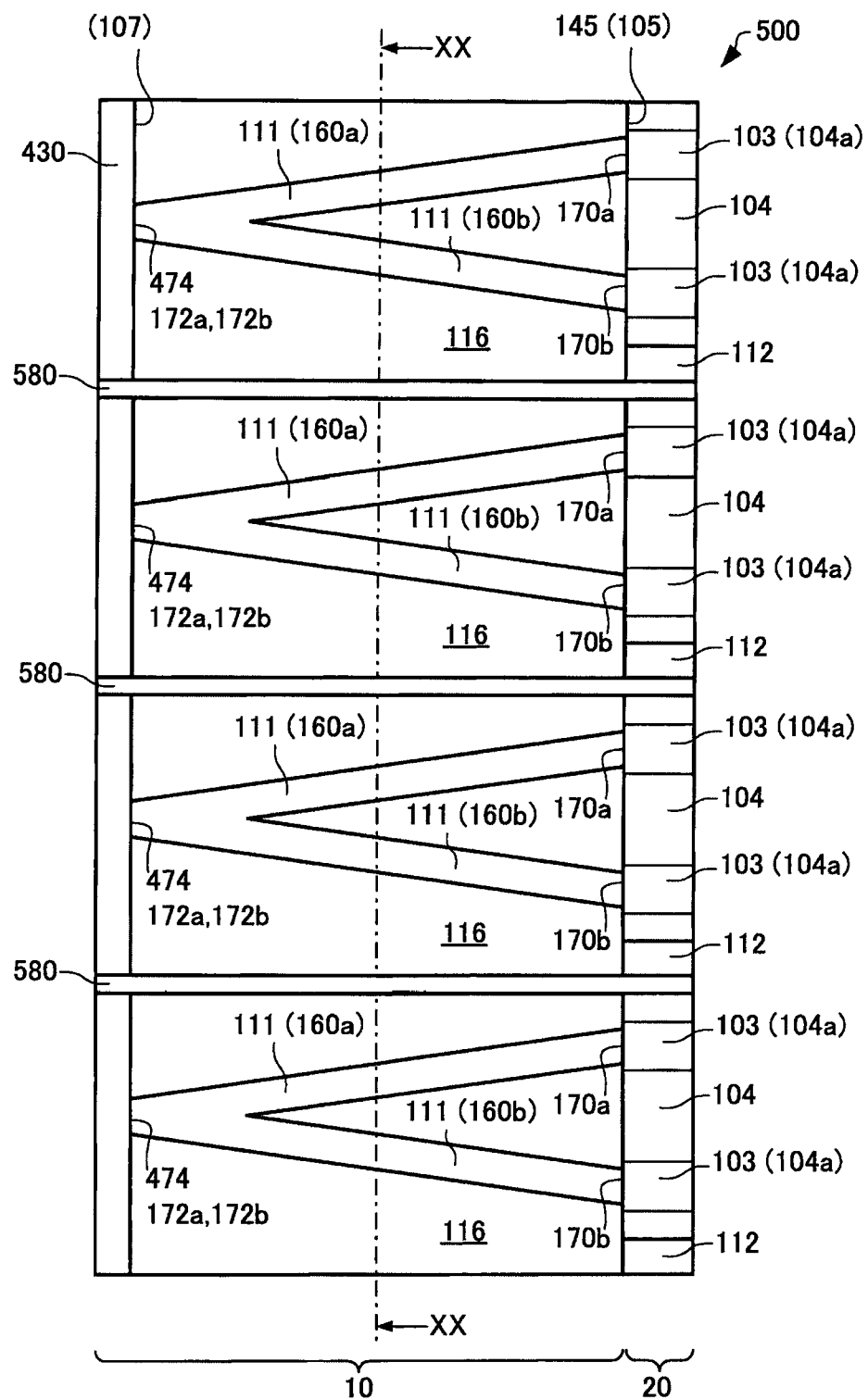
FIG. 19 is a plan view diagrammatically showing a light emitting and receiving device according to a variation of the second embodiment.
Figure 20:
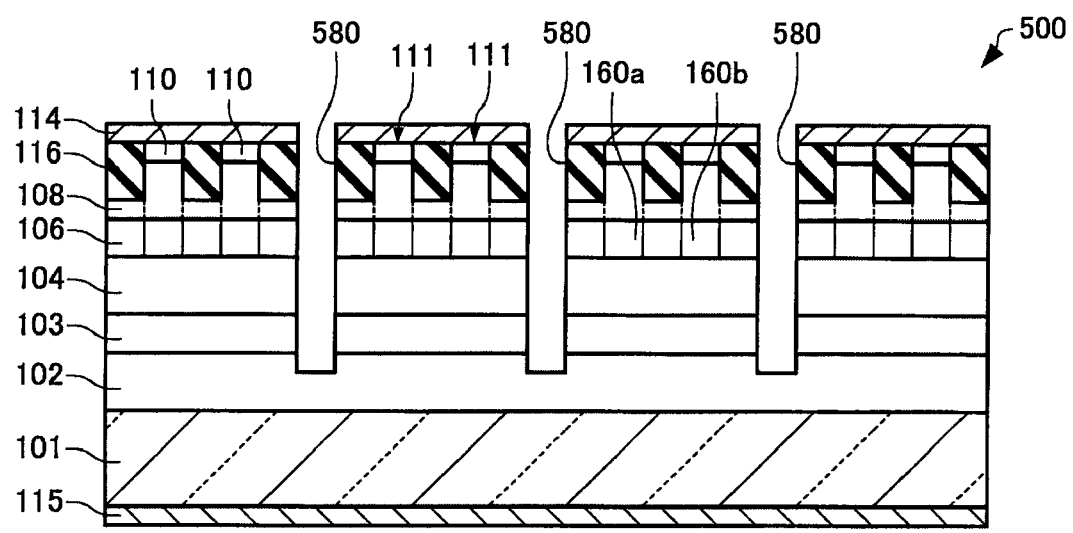
FIG. 20 is a cross-sectional view diagrammatically showing the light emitting and receiving device according to the variation of the second embodiment.

2.2. Light Emitting and Receiving Device According to Variation of Second Embodiment A light emitting and receiving device 500 according to a variation of the second embodiment will be described with reference to the drawings. FIG. 19 is a plan view diagrammatically showing the light emitting and receiving device 500. FIG. 20 is a cross-sectional view diagrammatically showing the light emitting and receiving device 500 taken along the line XX-XX in FIG. 19. In FIG. 19, the second electrode 114 is omitted for convenience. In the light emitting and receiving device 500 according to the variation of the second embodiment, the members having functions that are the same as those of the components of the light emitting and receiving device 400 according to the second embodiment have the same reference characters, and no detailed description of these members will be made below.

In the light emitting and receiving device 500, a plurality of pairs of gain regions 462 are arranged, as shown in FIG. 19. A plurality of first electrodes 112 are provided in correspondence with the plurality of pairs of gain regions 462. A separation groove 580 is formed between adjacent ones of the pairs of gain regions 462. It can also be said that the separation groove 580 is formed between adjacent ones of the first electrodes 112. The bottom surface of each of the separation grooves 580 is positioned below the lower surface of the light absorbing layer 103, as shown in FIG. 20. In the illustrated example, the bottom surface of each of the separation grooves 580 is positioned between the upper and lower surfaces of the third cladding layer 102. The separation grooves 580 are formed, for example, by using photolithography and etching techniques.

According to the light emitting and receiving device 500, the intensity of the emitted light can be higher than that in the light emitting and receiving device 400. Further, according to the light emitting and receiving device 500, any of the plurality of pairs of gain regions 462 and the corresponding light absorbing layer 103 are electrically separated from the other pairs of gain regions 462 and the respective light absorbing layers 103 by the separation grooves 580. The optical output from each of the plurality of pairs of gain regions 462 can therefore be monitored. That is, the amounts of light from the plurality of pairs of gain regions 462 can be individually detected.

The embodiments and the variations described above are presented by way of example, and the invention is not limited thereto. For example, the embodiments and the variations can be combined as appropriate.

While embodiments of the invention have been described above in detail, the skilled in the art will readily understand that many variations that do not substantially depart from the novel features and advantageous effects of the invention can be implemented. Therefore, such variations shall all be encompassed in the scope of the invention.

The entire disclosure of Japanese Patent Application No: 2009-120599, filed May 19, 2009 is expressly incorporated by reference herein.

What is claimed is:

1. A light emitting and receiving device including a first region and a second region adjacent to the first region in a plan view, the light emitting and receiving device comprising:
    a light absorbing layer formed in the first and second regions;
    a first cladding layer formed above the light absorbing layer;
    an active layer formed above the first cladding layer in the first region; and
    a second cladding layer formed above the active layer,
    wherein at least part of the active layer forms a gain region,
    a stepped side surface having an end surface of the gain region is formed at the boundary between the first region and the second region,
    light produced in the gain region exits through the end surface of the gain region, and
    part of the light having exited reaches the light absorbing layer in the second region and is received by the light absorbing layer.

2. The light emitting and receiving device according to claim 1, further comprising:
    a first electrode formed above the first cladding layer in the second region;
    a contact layer formed above the second cladding layer;
    a second electrode formed above the contact layer; and
    a third electrode formed below the light absorbing layer,
    wherein the plan shape of the gain region is the same as the plan shape of the surface where the contact layer comes into contact with the second electrode,
    the first and second electrodes are provided to produce light in the gain region, and
    the first and third electrodes are provided to receive the light having reached the light absorbing layer.

3. The light emitting and receiving device according to claim 1,
    wherein the first cladding layer in the second region has an opening,
    the light absorbing layer is exposed in the opening, and
    part of the light having exited reaches the light absorbing layer exposed in the opening and is received by the light absorbing layer.

4. The light emitting and receiving device according to claim 1,
    wherein the gain region extends from the end surface on a first side of the active layer to the end surface on a second side, which is the side that is opposite to the first side, of the active layer and is oriented in a direction inclined with respect to a normal to the first side,
    the end surface on the first side does not overlap with the end surface on the second side in a projection viewed from the first side, and
    at least the end surface on the first side forms the stepped side surface.

5. The light emitting and receiving device according to claim 1,
    wherein the second region is formed of two second regions, and
    the first region is disposed between the two second regions.

6. The light emitting and receiving device according to claim 1,
    wherein the gain region is formed of a plurality of gain regions,
    a separation groove is formed between adjacent ones of the gain regions, and
    the bottom surface of each of the separation grooves is positioned below the lower surface of the light absorbing layer.

7. The light emitting and receiving device according to claim 4,
    wherein in the wavelength band to which the light produced in the gain region belongs, the reflectance on the second side is higher than that on the first side,
    the gain region is formed of a plurality of gain regions, the plurality of gain regions forms at least one pair of gain regions, a first gain region, which is one of the pair of gain regions, is oriented in one direction, a second gain region, which is the other one of the pair of gain regions, is oriented in another direction that differs from the one direction, and the end surface on the second side of the first gain region overlaps with the end surface on the second side of the second gain region.

8. The light emitting and receiving device according to claim 7, wherein the pair of gain regions is formed of a plurality of pairs of gain regions, a separation groove is formed between adjacent ones of the pairs of gain regions, and the bottom surface of each of the separation grooves is positioned below the lower surface of the light absorbing layer.

* * * * *